US012035641B2

(12) United States Patent
Holmes et al.

(10) Patent No.: US 12,035,641 B2
(45) Date of Patent: Jul. 9, 2024

(54) JOSEPHSON JUNCTION DEVICE FABRICATED BY DIRECT WRITE ION IMPLANTATION (71) Applicant: INTERNATIONAL BUSINESS MACHINES CORPORATION, Armonk, NY (US)

(72) Inventors: Steven J. Holmes, Ossining, NY (US); Devendra K. Sadana, Pleasantville, NY (US); Oleg Gluschenkov, Tannersville, NY (US); Martin O. Sandberg, Ossining, NY (US); Marinus Johannes Petrus Hopstaken, Carmel, NY (US); Yasir Sulehria, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 25 days.

(21) Appl. No.: 17/564,133

(22) Filed: Dec. 28, 2021

(65) Prior Publication Data
US 2023/0210019 A1 Jun. 29, 2023

(51) Int. Cl.
H10N 60/12 (2023.01)
H10N 60/01 (2023.01)
H10N 60/80 (2023.01)
H10N 60/85 (2023.01)

(52) U.S. Cl.
CPC ......... H10N 60/12 (2023.02); H10N 60/0912 (2023.02); H10N 60/805 (2023.02); H10N 60/85 (2023.02)

(58) Field of Classification Search
CPC ... H10N 60/12; H10N 60/0912; H10N 60/805
See application file for complete search history.

(56) References Cited

U.S. PATENT DOCUMENTS

| 7,126,180 | B2 | 10/2006 | Park |
| 9,076,680 | B2 | 7/2015 | Busch et al. |
| 9,882,113 | B1* | 1/2018 | Henry ................. H01J 37/3056 |
| 10,037,493 | B2 | 7/2018 | Harris et al. |
| 10,097,143 | B2 | 10/2018 | Abdo |

(Continued)

OTHER PUBLICATIONS

Chiodi, F. et al., "All Silicon Josephson Junctions"; arXiv:1610.08453v1 (2016), 6 pgs.

(Continued)

Primary Examiner — Matthew L Reames
(74) Attorney, Agent, or Firm — Intelletek Law Group, PLLC; Gabriel Daniel, Esq.

(57) ABSTRACT

A Josephson Junction qubit device is provided. The device includes a substrate of silicon material. The device includes first and second electrodes of superconducting metal. The device may include a nanowire created by direct ion implantation on to the silicon material to connect the first and second electrodes. The device may include first and second superconducting regions created by direct ion implantation on to the silicon material, the first superconducting region connecting the first electrode and the second superconducting region connecting the second electrode, with a silicon channel formed by a gap between the first and second superconducting regions.

20 Claims, 6 Drawing Sheets

(56) References Cited

U.S. PATENT DOCUMENTS

| | | |
|---|---|---|
| 10,256,392 B1 | 4/2019 | Brink et al. |
| 10,367,133 B1 | 7/2019 | Tahan |
| 10,903,411 B2 | 1/2021 | Marcus et al. |
| 11,107,968 B1 | 8/2021 | Holmes et al. |
| 2019/0296210 A1 | 9/2019 | Brink et al. |
| 2020/0328339 A1 | 10/2020 | Shabani et al. |
| 2021/0226114 A1 | 7/2021 | Holmes et al. |

OTHER PUBLICATIONS

Wen, F. et al., "Josephson Junction Field-Effect Transistors for Boolean Logic Cryogenic Applications"; IEEE Transactions on Electron Devices (2019); vol. 66:12; pp. 5367-5374.

Thorgrimsson, B. et al., "The Effect of External Electric Fields on Silicon With Superconducting Gallium Nano-Precipitates"; arXiv:1911.06931v1 (2019); 11 pgs.

Grockowiak, A. et al., "Superconducting Properties of Laser Annealed Implanted Si:B Epilayers"; Superconductor Science and Technology (2013); vol. 26, 4 pp.

Shim, Y. et al. "Bottom-Up Superconducting and Josephson Junction Devices Inside A Group-IV Semiconductor"; Nature Communications (2014); 8 pgs.

Hoummada, K. et al., "Absence of Boron Aggregates in Superconducting Silicon Confirmed by Atom Probe Tomography"; Applied Physics Letters, American Institute of Physics (2012); 5 pgs.

Bustarret, E., et al., "Superconductivity in Doped Semiconductors"; Elsevier (2015); vol. 514, 27 pgs.

Bustarret, E., et al., "Superconductivity in Doped Cubic Silicon"; Nature Letters (2006); vol. 444; 4 pgs.

Bagraeva, N.T. et al., "Superconducting Properties of Silicon Nanostructures"; Semiconductors (2009); vol. 43:11, pp. 1441-1454.

List of IBM Patents or Patent Applications Treated as Related, 2 Pgs.

* cited by examiner

JOSEPHSON JUNCTION DEVICE FABRICATED BY DIRECT WRITE ION IMPLANTATION

BACKGROUND

Technical Field

The present disclosure generally relates to fabrication of semiconductor devices, and more particularly, to superconducting devices for quantum computing.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state. Various quantum phenomena, such as superposition and entanglement, do not have analogs in the world of classical computing and therefore may involve special structures, techniques, and materials.

In superconducting quantum computing, a qubit is typically a device based on a superconductor-insulator-superconductor (SIS) Josephson Junction (JJ). There are several different types of superconducting quantum bits such as phase qubits, charge qubits, transmon qubits and fluxonium qubits, all based around the Josephson junction. Such a superconducting device is also referred to as a JJ qubit device. A Josephson Junction utilizes the Josephson effect, which is a phenomenon that occurs when two superconductors are placed in proximity, with some barrier or restriction between them. It is an example of a macroscopic quantum phenomenon, where the effects of quantum mechanics are observable in the collective phase of a large ensemble of Cooper-pairs, rather than at an atomic scale.

SUMMARY

Some embodiments provide a Josephson Junction (JJ) qubit device. The device includes a substrate of silicon material. The device includes first and second electrodes of superconducting metal. In some embodiments, the device may include a nanowire created by direct ion implantation on to the silicon material to connect the first and second electrodes. In some embodiments, the device may include first and second superconducting regions created by direct ion implantation on to the silicon material, the first superconducting region connecting the first electrode and the second superconducting region connecting the second electrode, with a silicon channel formed by a gap between the first and second superconducting regions.

Some embodiments provide a process for fabricating the JJ device by direct write ion implantation. The process provides a substrate of silicon material and deposits superconducting metal over the substrate to form two or more electrodes. Direct write is performed to implant gallium or boron into the silicon material to form a superconducting structure. The process then performs annealing to activate the implanted gallium or boron in the superconducting structure.

In some embodiments, the silicon material forming the substrate may be silicon, silicon-germanium, and/or germanium. In some embodiments, the substrate is provided with a stop layer of silicon oxide for subsequent polishing operation. The superconducting metal forming the electrodes may be Niobium (Nb), Tantalum (Ta), Titanium Nitride (TiN), Tantalum Nitride (TaN), or Aluminum (Al). In some embodiments, the two electrodes form a superconducting capacitor or a resonator. In some embodiments, reactive-ion etching (RIE) is applied to the substrate to create a pattern for the electrodes (or the resonator or the capacitor), and the superconducting metal is deposited over the substrate with the pattern. Chemical-mechanical polishing (CMP) is used to remove a layer of the deposited metal and the stop layer of the substrate.

In some embodiments, the direct write forms a nanowire contacting two electrodes, and the nanowire includes a superconducting composition of silicon, silicon-germanium, or germanium that is lightly doped with boron or gallium. In some embodiments, the direct write forms two superconducting regions contacting two electrodes, and a gap between the two superconducting regions forms a silicon channel. In some embodiments, a liner of TaN prevents mixing of the superconducting metal forming the electrode with the silicon material of the substrate during the annealing process.

The preceding Summary is intended to serve as a brief introduction to some embodiments of the disclosure. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a Summary, Detailed Description and the Drawings are provided. Moreover, the claimed subject matter is not to be limited by the illustrative details in the Summary, Detailed Description, and the Drawings, but rather is to be defined by the appended claims, because the claimed subject matter can be embodied in other specific forms without departing from the spirit of the subject matter.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

In most Josephson Junction (JJ) devices the electrodes are formed by a convectional low temperature superconductor and the tunnel barrier is formed by a metal oxide (most common being $Al_2O_3$). Some embodiments of the disclosure provide a JJ device that is fabricated from silicon materials (e.g., silicon, silicon-germanium, or germanium) that can be crystalline, by means of direct writing of gallium (or boron) ion implantation onto the silicon material of the substrate. The direct write ion implantation creates a region of superconducting composition of silicon, silicon-germanium, or germanium with boron and/or gallium doping. In some embodiments, the direct write ion implantation forms a narrow strip of superconducting region that serves as an extended nanowire and a restriction junction of the JJ device. In some embodiments, the direct write ion implantation forms two superconducting regions with a narrow gap in between that serve as a silicon channel and a tunnel junction of the JJ device. The superconducting regions created by the direct write ion implantation share a contiguous or continuous crystalline structure with the substrate. The JJ device may be used to implement a qubit for quantum computing. The JJ device may also be used to create inductance for a superconducting resonator. Superconducting resonators have multitude of applications in superconducting quantum circuits, such as readout and qubit coupling.

Figure 1A:
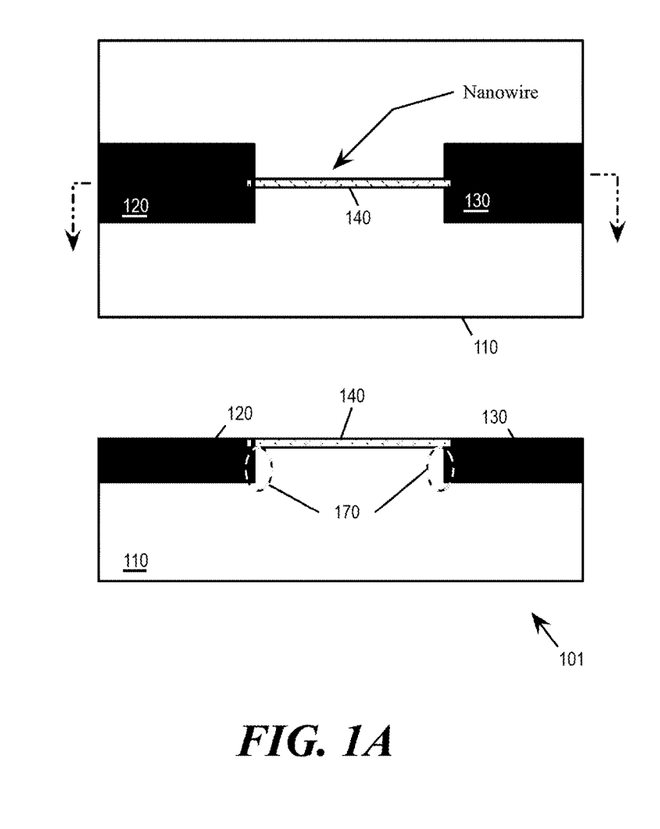
FIGS. 1A-B illustrates example JJ qubit devices that are fabricated by direct write ion implantation.
Figure 1B:
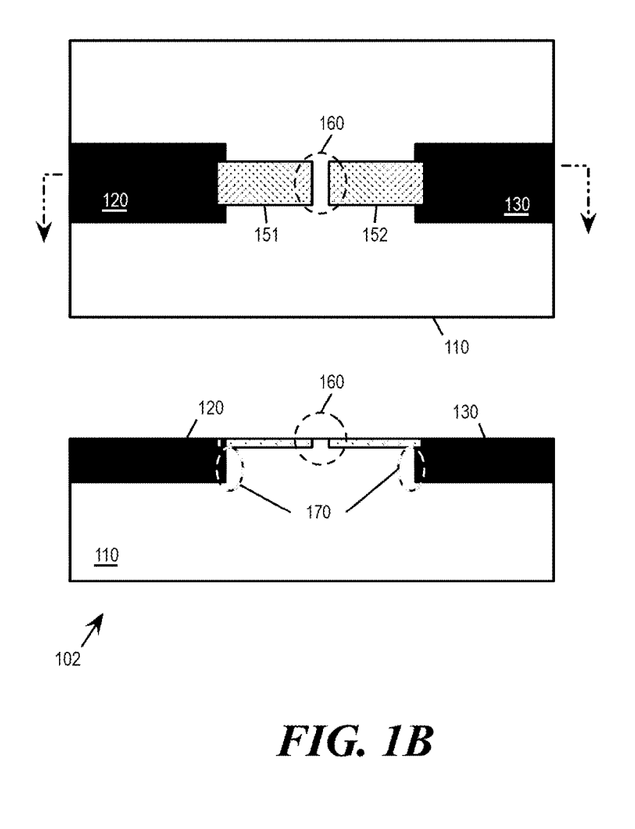

FIGS. 1A-B illustrates two example JJ qubit devices that are fabricated by direct write ion implantation. Each figure shows a top plan view and a cross section view for a JJ qubit device. FIG. 1A shows a JJ qubit device 101 for which direct write ion implantation is used to form a superconducting nanowire between two superconducting electrodes. FIG. 1B shows a JJ qubit device 102 for which direct write ion implantation is used to form a silicon channel.

Both the JJ device 101 and the JJ device 102 are superconducting devices that includes a substrate 110 of silicon material, two electrodes 120 and 130 of superconducting metal. For the JJ device 101, a nanowire 140 created by direct ion implantation on to the silicon material of the substrate 110 to connect the two electrodes 120 and 130 forms a restriction junction. The two electrodes may form a capacitor for a resonator. For the JJ device 102, two superconducting regions 151 and 152 are created by direct ion implantation on to the silicon material of the substrate 110, with the superconducting region 151 connecting the electrode 120 and the superconducting region 152 connecting the electrode 130. A silicon channel 160 formed by a narrow gap of silicon material between the two superconducting regions forms a tunnel junction. The nanowire 140 or the superconducting regions 151 and 152 created by the direct write ion implantation share a contiguous crystalline structure with the substrate 110.

In some embodiments, the JJ devices 101 and 102 are fabricated by direct writing superconducting Si/Ga by focused ion beam (FIB) of gallium (or boron) ion onto silicon material, annealing to activate the gallium, and forming capacitors/resonators by damascene. In some other embodiments, the JJ qubit device is fabricated by direct writing superconducting Si/Ga by FIB, annealing to activate the gallium, and forming capacitors/resonators by lift off processing. Superconducting resonators interfaced with paramagnetic spin ensembles may be used to increase the sensitivity of electron spin resonance and are key elements of microwave quantum memories.

In some embodiments, the silicon material forming the substrate may be silicon, silicon-germanium, or germanium. The superconducting metal forming the electrodes can be Niobium (Nb), Tantalum (Ta), Titanium Nitride (TiN), Tantalum Nitride (TaN), or Aluminum (Al). The nanowire 140 or the superconducting regions 151 and 152 that are created by direct write of ion implantation may be a superconducting composition of silicon, silicon-germanium, or germanium that is (lightly) doped with boron or gallium doping. In some embodiments, a liner 170 of TaN prevents mixing of the superconducting metal forming the electrode 120 or 130 with the silicon material of the substrate 110 during annealing of gallium or boron into the silicon of the substrate 110.

FIGS. 2A-2I illustrate the stages of fabricating the example vertical JJ qubit devices 101 and 102. Each figure shows a top plan view and a frontal cross section view of the device.

Figure 2A:
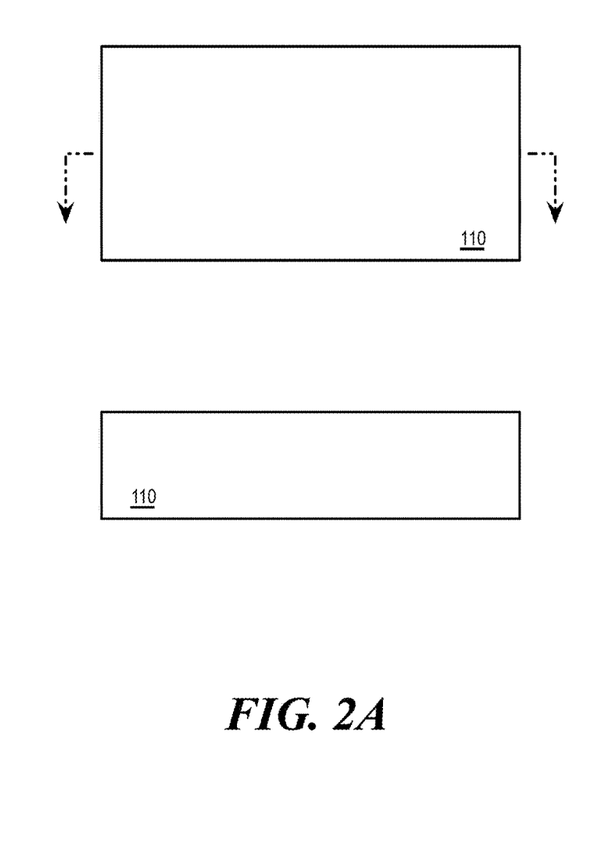
FIG. 2A shows a substrate of silicon material for fabricating an example vertical JJ qubit device.
Figure 2B:
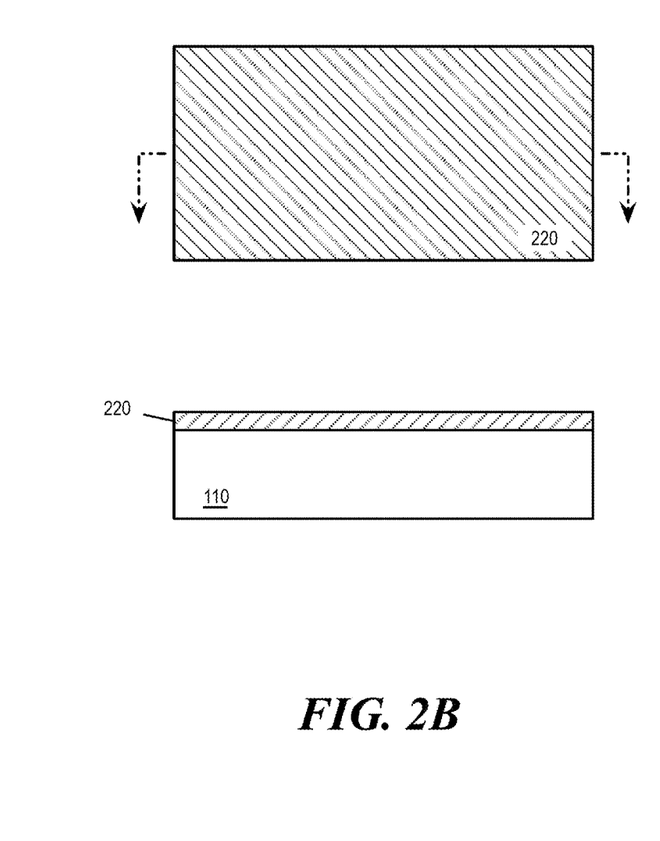
FIG. 2B shows a stop layer being applied to the substrate as polish stop for subsequent chemical-mechanical polishing (CMP) operations.
Figure 2C:
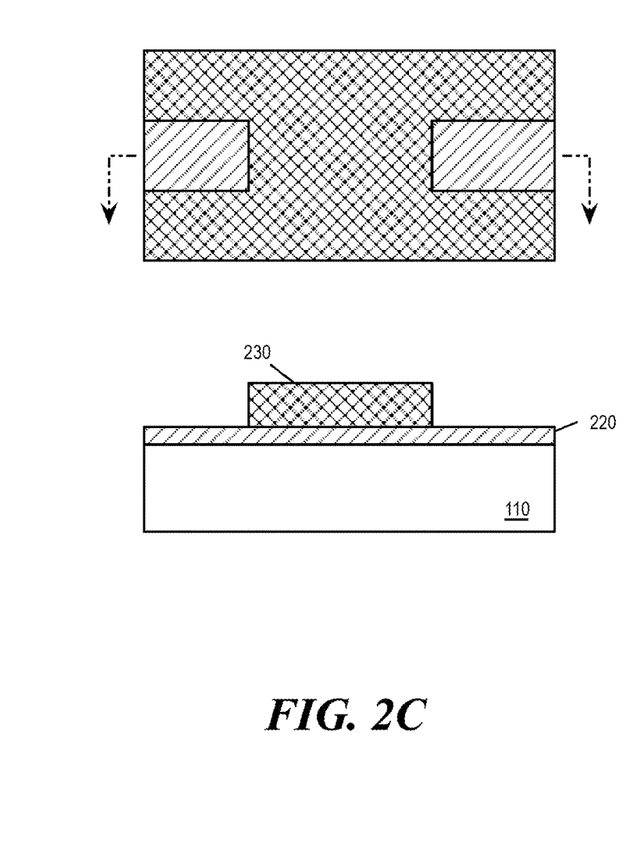
FIG. 2C shows a resist pattern being applied over the stop layer for forming electrodes.
Figure 2D:
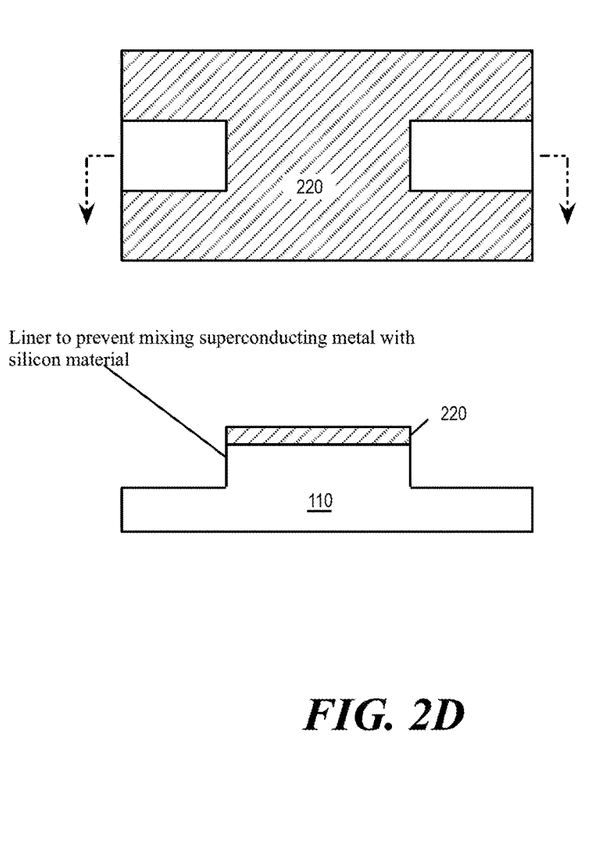
FIG. 2D shows the surface of the substrate after etching.

FIG. 2A shows the substrate 110 of silicon material. FIG. 2B shows a stop layer 220 (e.g., dielectric, silicon oxide or silicon nitride) being applied to the substrate 110 as polish stop for subsequent CMP operations. FIG. 2C shows a resist pattern 230 being applied over the stop layer 220 for forming the electrodes 120 and 130. FIG. 2D shows the surface of the substrate after etching (e.g., reactive-ion etching, or RIE). The etching process creates patterns for forming the electrodes 120 and 130 and strip the resist. The etching process removes the regions of the stop layer that are not protected by the pattern of resists. In some embodiments, liners (e.g., TaN) are applied to silicon material exposed by etching to prevent mixing of the superconducting metal with the silicon material during subsequent annealing of Gallium or Boron into Silicon.

Reactive-ion etching, or RIE is an etching technology used in microfabrication. RIE uses chemically reactive plasma to remove material deposited on wafers. The plasma is generated under low pressure (vacuum) by an electromagnetic field. High-energy ions from the plasma attack the wafer surface and react with it.

Figure 2E:
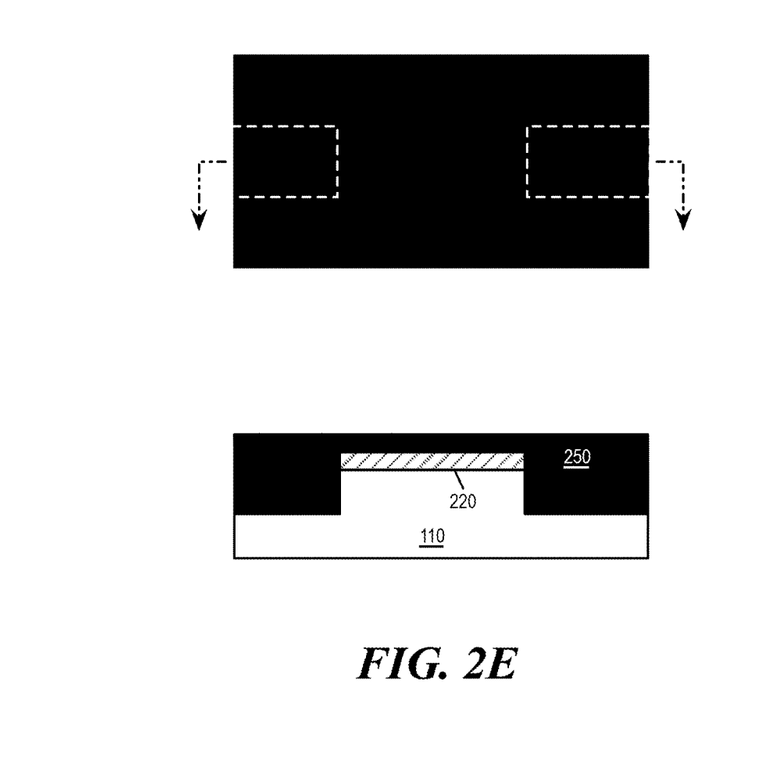
FIG. 2E shows a superconductor being deposited on the etched surface of the substrate for forming the electrodes by damascene.
Figure 2F:
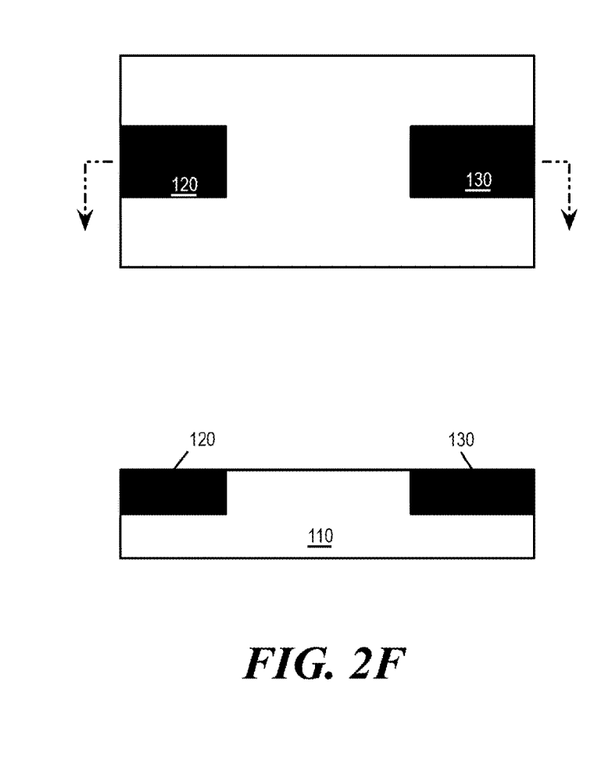
FIG. 2F shows the result of CMP, by which a layer of superconductor and the stop layer are removed.

FIG. 2E shows superconductor 250 being deposited on the etched surface of the substrate 110 for forming the electrodes 120 and 130 by damascene. The deposited superconductor 250 can be any of Nb, Ta, TaN, TiN, Al. FIG. 2F shows the result of chemical-mechanical polishing (CMP), by which a layer of superconductor and the stop layer are removed, forming the electrodes 120 and 130 and exposing the silicon material for direct write ion implantation. CMP is a polishing process assisted by chemical reactions to remove surface materials. Damascene is an additive patterning process for depositing metal. In this process, the underlying silicon oxide insulating layer (or stop layer) is patterned with open trenches where the conductor should be, a thick coating of conductor that significantly overfills the trenches is deposited on the insulator, and CMP is used to remove the stop layer and the conductor that extends above the top of the stop layer.

Figure 2G:
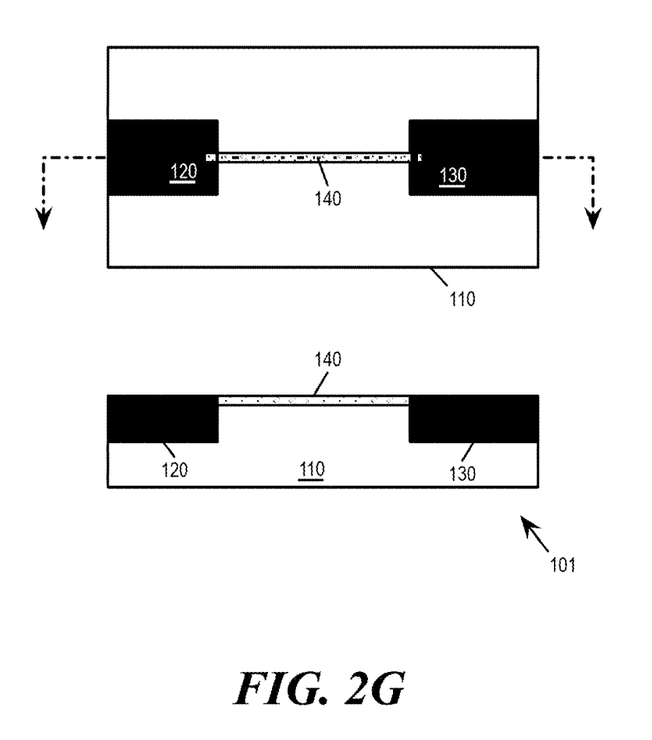
FIG. 2G shows direct write ion implantation used to create the nanowire of the JJ device.
Figure 2H:
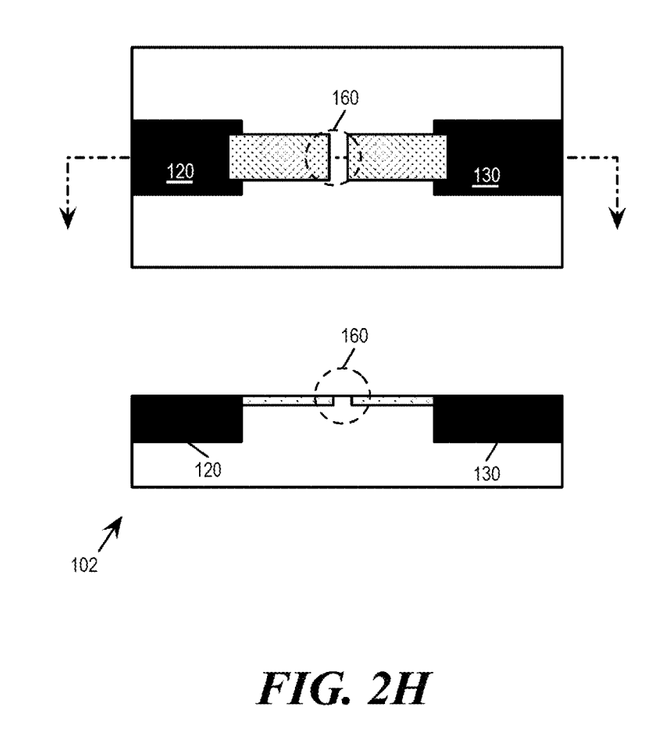
FIG. 2H shows direct write ion implantation used to create the silicon channel of the JJ device.

FIG. 2G shows direct write ion implantation used to create the nanowire 140 of the JJ device 101. The nanowire is created by using focused ion beam (FIB) to directly writing gallium or boron ions onto the silicon material (Si, SiGe or Ge) exposed by the CMP. The nanowire has contacts with the electrode 120 and the electrode 130 and forms a restriction junction. FIG. 2H shows direct write ion implantation used to create the silicon channel of the JJ device 102. Specifically, FIB is used to create the two superconducting regions 151 and 152 by directly writing gallium ions onto the silicon material (Si, SiGe or Ge) exposed by the CMP. The gap of silicon material between the two regions 151 and 152 without ion implantation forms the silicon channel 160 as a tunnel junction for the JJ device 102. Annealing is performed after the direct write to activate the gallium or boron in the silicon of the substrate 110.

FIB systems use a finely focused beam of ions that can be operated at low beam currents for imaging or at high beam currents for site specific sputtering or milling. Nanowire is a nanostructure, with the diameter of the order of a nanometer ($10^{-9}$ meters). More generally, nanowires can be defined as structures that have a thickness or diameter constrained to tens of nanometers or less and an unconstrained length. At these scales, quantum mechanical effects are important. Thus, nanowire is also referred to as quantum wires. Many different types of nanowires exist, including superconducting, metallic, semiconducting, and insulating.

Figure 3:
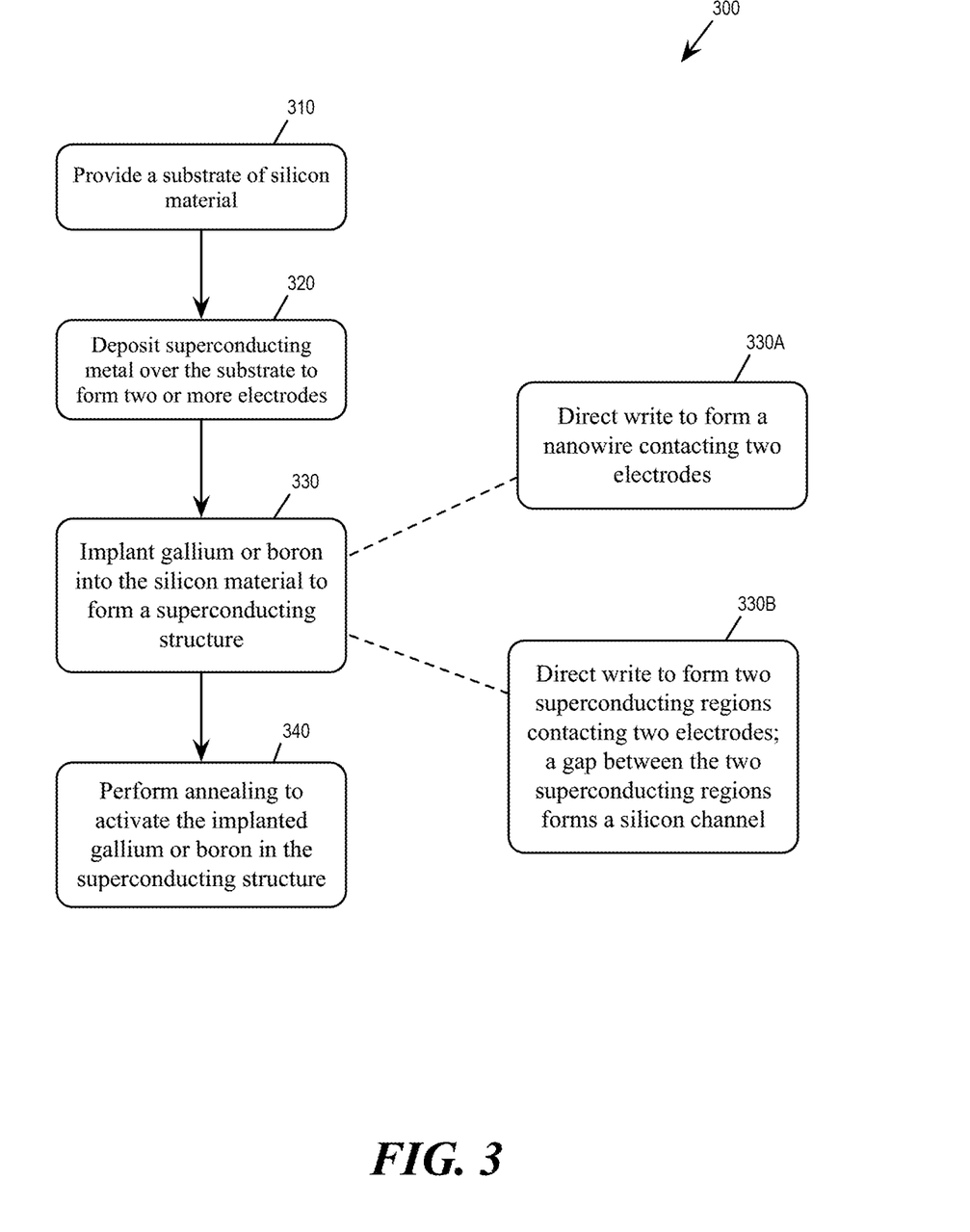
FIG. 3 conceptually illustrates a process for fabricating a vertical JJ qubit device, consistent with an illustrative embodiment.

FIG. 3 conceptually illustrates a process 300 for fabricating a vertical JJ qubit device, consistent with an illustrative embodiment. In some embodiments, one or more semiconductor manufacturing equipment are used to perform the process 300.

At block 310, the process provides a substrate of silicon material. The silicon material forming the substrate may be silicon, silicon-germanium, or germanium. In some embodiments, the substrate is provided with a stop layer of silicon oxide for subsequent polishing operation.

At block 320, the process deposits superconducting metal over the substrate to form two or more electrodes. The superconducting metal forming the electrodes may be Nb, Ta, TaN, TiN, and Al. In some embodiments, the two electrodes form a superconducting capacitor for a resonator. In some embodiments, the reactive-ion etching (RIE) is applied to the substrate to create a pattern for the electrodes (or the resonator or the capacitor), and the superconducting metal is deposited over the substrate with the pattern. Chemical-mechanical polishing (CMP) is used to remove a layer of the deposited metal and the stop layer of the substrate. Etching (ME) to create pattern for electrode is described by reference to FIGS. 2C and 2D. Depositing superconducting metal to create electrodes is described by reference to FIGS. 2E and 2F. In some embodiments, the resonator or capacitor is formed by lift-off process, which is a method of creating structures (patterning) of a target material on the surface of a substrate using a sacrificial material (e.g., photoresist). It is an additive technique as opposed to more subtracting technique like etching.

At block 330, the process directly writes into the silicon material to form a superconducting structure by implanting gallium or boron. In some embodiments, the direct write forms a nanowire contacting two electrodes (at block 330A). Thus, the nanowire includes a superconducting composition of silicon, silicon-germanium, or germanium that is (lightly) doped with boron or gallium. In some embodiments, the direct write forms two superconducting regions contacting two electrodes, and a gap between the two superconducting regions forms a silicon channel (at block 330B). Thus, the superconducting region includes a superconducting composition of silicon, silicon-germanium, or germanium that is (lightly) doped with boron or gallium doping. The nanowire and/or the superconducting regions created by the direct write ion implantation share a contiguous crystalline structure with the substrate.

At block 340, the process performs annealing to activate the implanted gallium or boron in the superconducting structure. In some embodiments, a liner of TaN prevents mixing of the superconducting metal forming the electrode with the silicon material of the substrate during the annealing process.

The flowchart in FIG. 3 illustrates the operation of possible implementations of systems, methods, and computer program products according to various embodiments of the present disclosure. In this regard, each block in the flowchart may represent a module, segment, or portion of instructions for implementing the specified operation(s). In some alternative implementations, the operations noted in the blocks may occur out of the order noted in the FIG. 3. For example, two blocks shown in succession may, in fact, be executed substantially concurrently, or the blocks may sometimes be executed in the reverse order, depending upon the operations involved.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
    a substrate;
    first and second electrodes of superconducting metal; and
    a nanowire comprising a superconducting region of the substrate that is doped with gallium, the nanowire connecting the first and second electrodes to form a restriction junction of the device,
    wherein a length of the nanowire is longer than a width of the nanowire.

2. The semiconductor device of claim 1, wherein a material forming the substrate comprises one of silicon, silicon-germanium, or germanium.

3. The semiconductor device of claim 1, wherein the superconducting metal forming the electrodes comprises at least one of Niobium (Nb), Tantalum (Ta), Titanium Nitride (TiN), Tantalum Nitride (TaN), or Aluminum (Al).

4. The semiconductor device of claim 1, wherein a material of the nanowire and a material of the substrate share a contiguous crystalline structure.

5. The semiconductor device of claim 1, wherein the nanowire comprises a superconducting composition of one of silicon, silicon-germanium, or germanium that is doped with boron or gallium.

6. The semiconductor device of claim 5, further comprising a liner of Tantalum Nitride (TaN) that is operative to prevent mixing of the superconducting metal forming the electrode with a material of the substrate during annealing of the gallium or boron into the silicon.

7. The semiconductor device of claim 1, wherein the two electrodes form a capacitor or a resonator.

8. A semiconductor device comprising:
    a substrate;
    first and second electrodes of superconducting metal;
    first and second superconducting regions of the substrate that is doped with gallium, the first superconducting region connecting the first electrode and the second superconducting region connecting the second electrode; and
    a silicon channel comprising a gap between the first and second superconducting regions to form a tunnel junction of the device,
    wherein a length of each of the first and second semiconductor regions is longer than a width of each of the first and second semiconductor regions.

9. The semiconductor device of claim 8, wherein a material of the superconducting regions and a material of the substrate share a continuous crystalline structure.

10. The semiconductor device of claim 8, wherein each superconducting region comprises a superconducting composition of one of silicon, silicon-germanium, or germanium that is doped with boron or gallium.

11. A method of fabricating a superconducting device, comprising:
    providing a substrate of silicon material;
    depositing superconducting metal over the substrate to form two electrodes; and
    using ion implantation to deposit gallium into the silicon material substrate to form a nanowire contacting the two electrodes,
    wherein a length of the nanowire is longer than a width of the nanowire.

12. The method of claim 11, further comprising annealing to activate the gallium in the silicon material.

13. The method of claim 11, wherein the nanowire comprises a superconducting composition of one of silicon, silicon-germanium, or germanium that is doped with boron or gallium.

14. A method of fabricating a superconducting device, comprising:
    providing a substrate;
    depositing superconducting metal over the substrate to form two electrodes; and
    using ion implantation to deposit gallium into the substrate to form two superconducting regions, each superconducting region contacting one of the two electrodes, wherein:
    a gap between the two superconducting regions forms a silicon channel; and
    a length of each semiconductor region is longer than a width of each semiconductor region.

15. The method of claim 14, wherein a material forming the substrate comprises silicon, silicon-germanium, or germanium and the superconducting metal forming the electrodes is at least one of Niobium (Nb), Tantalum (Ta), Titanium Nitride (TiN), Tantalum Nitride (TaN), or Aluminum.

16. The method of claim 14, wherein the direct ion implantation comprises directly implanting gallium or boron ion on to the substrate and annealing the gallium or boron ion into the substrate.

17. The method of claim 14, wherein the superconducting region comprises a superconducting composition of one of silicon, silicon-germanium, or germanium that is doped with boron or gallium.

18. The method of claim 17, wherein a liner of Tantalum Nitride (TaN) prevents mixing of the superconducting metal forming the electrode with a silicon material of the substrate during annealing of gallium or boron into the silicon.

19. The method of claim 14, wherein the two electrodes form a superconducting capacitor or a resonator.

20. The method of claim 14, further comprising:
    applying reactive-ion etching (RIE) to the substrate to create a pattern for a resonator or capacitor;
    depositing the superconducting metal over the substrate with the pattern; and
    performing chemical-mechanical polishing (CMP) to remove a layer of the deposited metal and a stop layer of the substrate, wherein the stop layer comprises silicon oxide.

* * * * *